United States Patent [19]
Paquet

[11] Patent Number: 5,985,378
[45] Date of Patent: Nov. 16, 1999

[54] REMOTE-PLASMA-CVD METHOD FOR COATING OR FOR TREATING LARGE-SURFACE SUBSTRATES AND APPARATUS FOR PERFORMING SAME

[75] Inventor: Volker Paquet, Mainz, Germany

[73] Assignee: Schott Glaswerke, Mainz, Germany

[21] Appl. No.: 08/953,604

[22] Filed: Oct. 17, 1997

[30] Foreign Application Priority Data

Oct. 30, 1996 [DE] Germany .......................... 196 43 865

[51] Int. Cl.⁶ ................................................. C23C 16/50
[52] U.S. Cl. ........................ 427/562; 427/569; 427/571; 427/575; 427/255.5; 216/67; 216/69; 216/71
[58] Field of Search ................... 427/562, 569, 427/571, 575, 255.5; 118/718, 723 ME, 723 ER, 723 IR; 216/67, 69, 71

[56] References Cited

U.S. PATENT DOCUMENTS

| | | | |
|---|---|---|---|
| 5,017,404 | 5/1991 | Paquet et al. | 118/723 ME |
| 5,030,475 | 7/1991 | Ackermann et al. | 118/723 ME |
| 5,560,779 | 10/1996 | Knowles et al. | 118/723 MP |
| 5,789,040 | 8/1998 | Martinu et al. | 427/575 |
| 5,807,615 | 9/1998 | Sindzingre et al. | 427/563 |

FOREIGN PATENT DOCUMENTS

| | | |
|---|---|---|
| 0 343 355 A1 | 11/1989 | European Pat. Off. . |
| 0 503 0 82 A1 | 9/1992 | European Pat. Off. . |
| 38 30 249 C2 | 7/1990 | Germany . |
| 39 26 023 C2 | 7/1991 | Germany . |
| 39 23 188 C2 | 7/1992 | Germany . |
| 42 11 746 A1 | 10/1993 | Germany . |
| 2 226 049 | 6/1990 | United Kingdom . |

OTHER PUBLICATIONS

Patent Abstracts of Japan, vol. 013, No. 069 (C–569), Feb. 16, 1989 & JP 63 262466 A (hitachi Ldt), Publication Date: Oct. 28, 1998.

Patent Abstracts of Japan, vol. 015, No. 450 (C–0885), Nov. 15, 1991 & JP 03 191068 A (Matsushita Electric Ind Co LTD),Publication Date: Aug. 21, 1991.

Patent Abstracts of Japan, vol. 013, No. 414 (C–635), Sep. 13, 1989 & JP 01 149965 A (Hitachi Ltd), Publication Date: Jun. 13, 1989.

Patent Abstracts of Japan, vol. 009, No. 188 (C–295), Aug. 3, 1985 & JP 60 054996 A (Kagakugijutsucho Muki Zaishitsu Kenkyusho; others: OJ), Publication Date: Mar. 29, 1985.

Primary Examiner—Timothy Meeks
Attorney, Agent, or Firm—Michael J. Striker

[57] ABSTRACT

The remote-plasma-CVD process for coating or treating large-surface substrates includes exciting an excitation gas located remotely from a substrate surface to be coated or treated in modular plasma source devices arranged either in a linear arrangement or in a planar, grid-like arrangement over the substrate surface and feeding a reactant gas with the excitation gas from the plasma source devices to the substrate surface to excite the reactant gas with the excitation gas and thus form a coating on the substrate surface or treat the substrate surface.

4 Claims, 7 Drawing Sheets

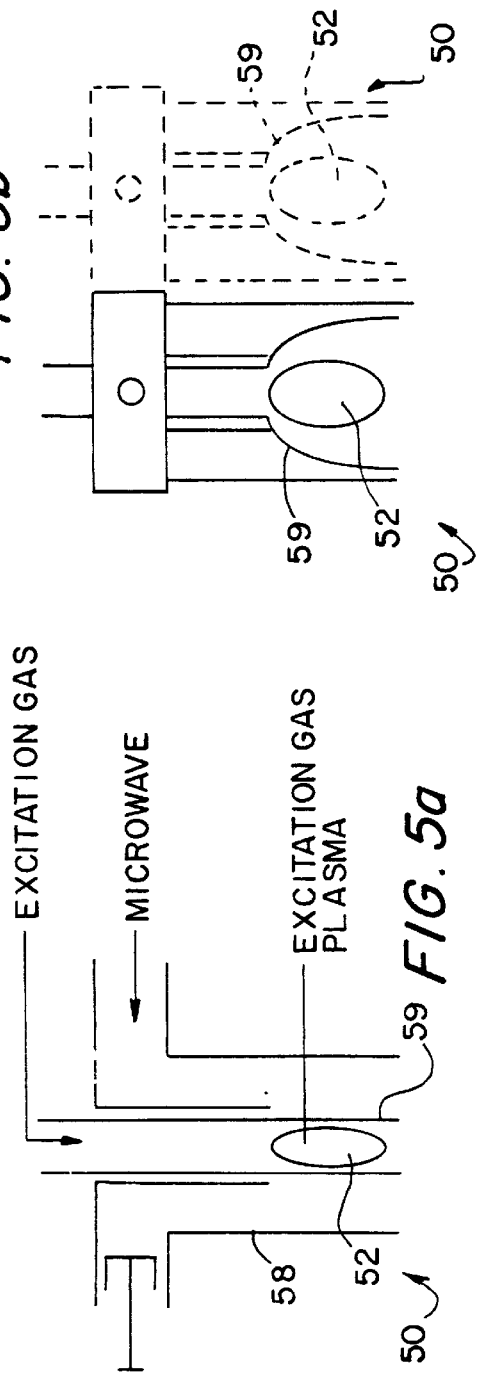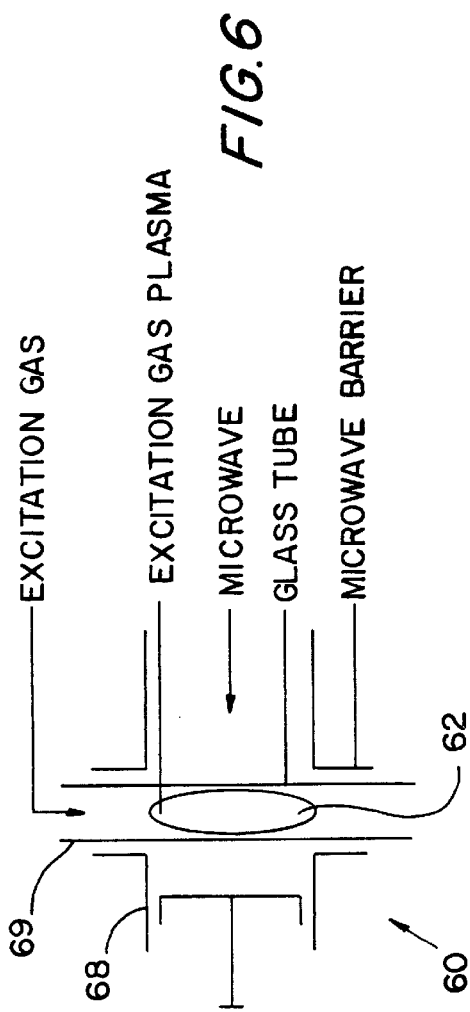

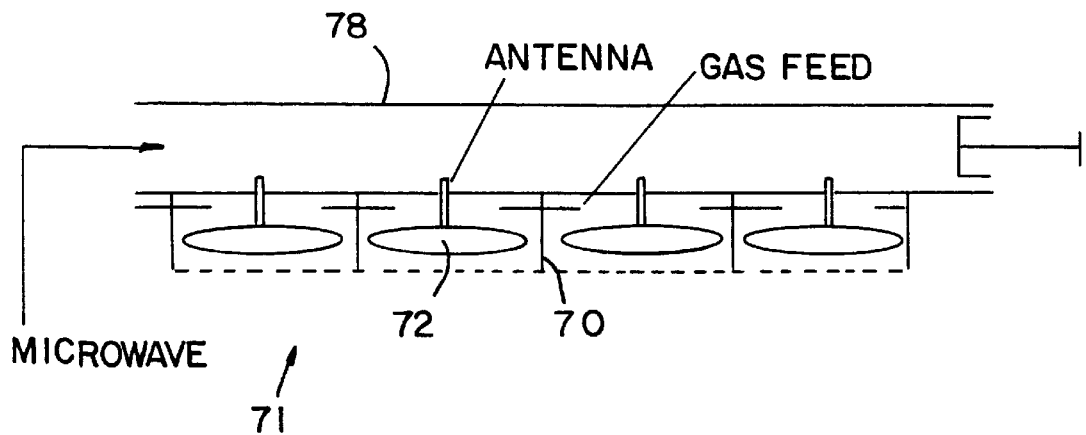
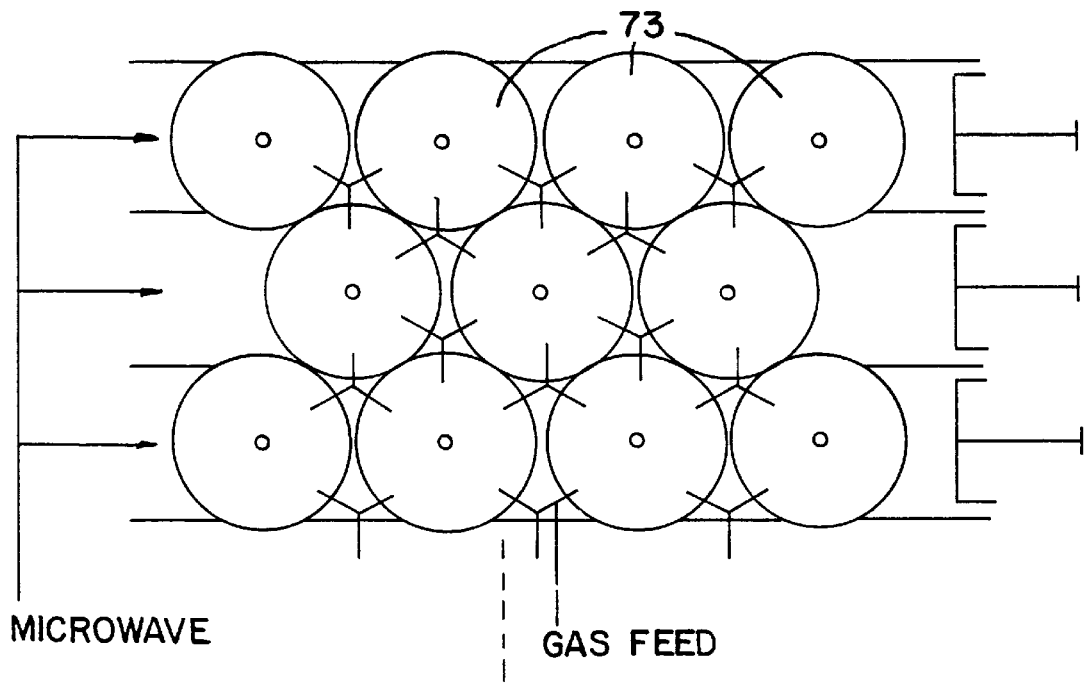

REMOTE-PLASMA-CVD METHOD FOR COATING OR FOR TREATING LARGE-SURFACE SUBSTRATES AND APPARATUS FOR PERFORMING SAME

BACKGROUND OF THE INVENTION

The present invention relates to a remote-plasma-CVD process for coating or treating a large-surface substrate in which a coating gas is excited by an excitation gas, which has been excited remotely from the substrate to be coated or treated and by means of a plasma.

Plasmas, which are excited by action of electrical energies of different frequencies—from null (direct voltages) to microwave frequencies—, are often used to treat substrate surfaces. The electromagnetic energy can act then so that the reactant gas plasma is provided in direct contact with the substrate to be treated, so that the reactant gas decomposes into reactive species, which act on the substrate surface, or so that the plasma is produced in an excitation gas remote from the substrate surface and the excitation gas excites the reactant gas. In the latter case a so-called remote plasma (other designations include: down-stream plasma and afterglow plasma) is involved.

Remote-plasma-CVD processes are known and are described many times in the literature. In a remote-plasma-CVD process for coating of substrates an excitation gas ("gas type A") comprising a non-coating forming gas or a mixture of several non-coating forming gases passes through a discharge zone, in which excited and atomic species are formed. The term "non-coating-forming gas" means e.g. noble gases, $O_2$, $H_2$ and $N_2O$. This excitation gas is mixed with a coating-forming gas("gas type B") comprising a single coating-forming gas or several gases, of which at least one is a coating-forming gas in a discharge-free region (Afterglow) remote from the excitation source. The term "coating-forming gas" means a so-called precursor gas, e.g. $TiCl_4$ or $SiH_4$.

The gas actually used to treat or coat the substrate is formed by the excitation gas and the coating-forming gas together. The coating-forming gas, separately from the excitation gas, may also pass through an excitation zone; its composition and excitation field strength must be selected in this case so that it is not pre-reacted or is non-coating.

In a region in which the excitation gas and the coating-forming gas are mixed an interaction between the excitation gas and the coating-forming gas occurs, which essentially causes a transfer of excitation energy of molecules or atoms from gas type A to molecules or atoms of gas type B and causes a homogeneous pre-reaction. The pre-reacted components then react heterogeneously with the substrate and form the coating on it.

The advantages of the remote, in contrast to the conventional, plasma CVD process, in which the plasma is in direct contact with the substrate surface to be treated or coated are:

The substrate undergoes no radiation damage in remote-plasma-CVD process, since it is not exposed to the high energy components from the plasma.

For the same reason substrate heat up is at most insignificant.

A conductive coating can be made without difficulties, since, in contrast to other non-remote apparatuses, microwave windows are so far from the coating region that they are not coated with a conductive coating and thus not blocked for further transmission of microwaves.

A conductive substrate can be coated without difficulty, since the fields plasma of a plasma-exciting radiation are not influenced by it.

During excitation by means of microwaves a potential microwave-field distribution from the discharge zone to the substrate does not occur in practice, because of equalizing diffusion processes in the excitation gas on the path between excitation location and substrate.

The corresponding applies to the treatment of substrate surfaces, whereby by "treatment" an etching or property change on the surface should be understood(e.g. wettability).

Generally the coating or treatment of substrate surfaces should be made as uniform as possible. Usually the plasma is produced by microwave discharge. In this case difficulties occur in the uniform coating or treatment of substrate surfaces, when the dimensions of the substrate surface are on the order of the wavelengths used or more.

German Patent Document DE 39 23 188 C2 discloses a remote-plasma-CVD process for making thin layers on large-surface substrates. DE 39 23 188 C2 teaches uniform distribution of an excitation gas and a coating-forming gas over a path which extends over the width of the reaction chamber and formation of a laminar flow over the substrate by flow engineering techniques. On the same path the excitation gas is converted into the plasma state by microwave radiation passing through the window of an elongated resonator whose width corresponds to that of the rectangular hollow wave guide providing the microwave radiation and widening like a funnel; it is mixed with the coating-forming gas in the reaction chamber.

In this apparatus the following problems occur: The microwaves supplied to the resonator can interfere with each other and excite the excitation gas differently periodically over the outlet width. This periodicity results in differences in the properties of the deposited coating, which depend on the degree of excitation. The reactor is fixed; coating properties may not be influenced by geometric parameters of the reactor. Furthermore the rectangular hollow wave guide can be widened only to a limited extent, so that it is not possible to coat a substrate with a larger surface area to be coated in this reactor.

GB-PS 222 60 49 describes a remote-plasma-CVD apparatus for making a thin coating on a stationary substrate. The exhaust gas from the reaction is drawn out through a gas outlet under the substrate. The substrate may be coated by flowing the excitation gas plasma formed in a microwave hollow wave guide through a complicated shower arrangement in the direction of a coating-forming gas, which similarly flows from a gas shower device comprising a perforated pipe or tube in the direction of the substrate. So that a uniform coating-forming gas distribution over the entire substrate surface is obtained in spite of differing pressure conditions in the pipe or tube, the outlet holes in the perforated pipe or tube must be of differing diameters. The uniformity of the coating adjusted in this manner is attained only for a fixed process parameter relationship, which sets the relation ship of the values of the coating region, gas mass flows, gas type, process pressure and gas pressure. Another parameter choice or other substrate size requires significant pre-experimentation to newly find the conditions required to obtain a uniform gas distribution. Correspondingly it is not possible to increase the excitation gas spray or shower indefinitely without limit in order to be free in the size of the coating region since the excitation degree of the gas in its edge region decreases to strongly away from a certain size of the gas shower.

DE 39 26 023 C2 discloses a linear remote plasma source, in which the plasma for the excitation gas is produced in a microwave wave guide. The excitation gas flows through a glass tube and forms an interior conductor in a coaxial microwave wave guide in the plasma state. The excitation gas can issue through a longitudinal slot in the glass tube, exciting a laterally flowing coating-forming gas and thus causing the coating process to occur. Since both the microwave power drop and loss occurs in the excitation gas on the z-axis of the excitation tube, the coating is necessarily nonuniform in this coordinate. An additional disadvantage is the limited length of this apparatus.

FIG. 3 of this patent shows an embodiment with two parallel operable microwave arrangements which are arranged behind each other. This embodiment operates using Photo-CVD excitation. Also this apparatus has the same above-described disadvantages as the individual sources.

DE 38 30 249 C2 describes a process for coating of large-surface substrates by means of a "direct" plasma, in which a plurality of plasma electrodes arranged in a grid-like arrangement over the substrate surface generate a large-surface plasma zone, preferably by microwave excitation, comprising a plurality of overlapping plasma columnar regions. Although very good results were obtained with this process, edge effects in the vicinity of the overlapping plasma columnar regions are not completely avoided.

SUMMARY OF THE INVENTION

It is an object of the present invention to provide a process and apparatus for coating and/or treating a substrate by means of a plasma, which provides a large-surface substrate with a uniform coating and/or a uniform treatment, and with which an adjustment to different substrate geometry is possible in a simple manner.

According to the invention, the remote-plasma-CVD process for coating or treating large-surface substrates comprises the steps of:

a) exciting an excitation gas located remotely from a substrate surface to be coated or treated in a plurality of modular plasma source devices arranged either in a linear arrangement over the substrate surface or in a planar, grid-like arrangement over the substrate surface; and b) feeding a reactant gas with the excitation gas from the plasma source devices to the substrate surface to excite the reactant gas with the excitation gas and thus form a coating on the substrate surface or to treat the substrate surface.

In a preferred embodiment of the invention the remote-plasma-CVD process for coating or treating large-surface substrates comprises the steps of:

a) arranging a plurality of independently energizable and controllable plasma electrodes in a grid arrangement over a substrate surface to be coated or treated;

b) generating a large-surface plasma zone in direct contact with the substrate surface by energizing the plasma electrodes, the large-surface plasma zone comprising a plurality of plasma columnar regions and overlapping zones formed by overlap of individual plasma columnar regions; and c) moving the substrate surface relative to the grid arrangement of the plasma electrodes so that each position on the substrate surface passes for respective equal distances under the plasma columnar regions and the overlapping zones. This preferred embodiment is a substantial improvement of the conventional plasma CVD process described in DE 38 30 249 C2.

The apparatus according to the invention for performing the process according to the invention comprises a reaction chamber for the substrate to be treated or coated, means for feeding a reactant gas into the reaction chamber, means for exciting an excitation gas by forming a plasma in the excitation gas, means for feeding the excitation gas into the reaction chamber with the reactant gas in the presence of the substrate to be coated or treated and means for removing exhaust gas from the reaction chamber. The means for exciting an excitation gas by forming a plasma in the excitation gas comprises a plurality of modular plasma source devices arranged either in a linear arrangement or in a planar or flat, grid-like arrangement over the substrate.

The term "plasma source device" in the sense of this invention means a device in which the excitation gas remote from the substrate surface to be coated is put into an excited state by means of a plasma.

A plasma source device can have a very simple structure. In the simplest case it has an excitation chamber, in which the plasma is generated in an excitation gas, means for supply of the excitation gas and means for conducting energy into it for production of the plasma as well as devices which feed the excitation gas in the direction of the substrate. The plasma source device can furthermore, e.g., have means for the admission and/or exhaust or removal of the reactant gas and/or consumed or reacted gases and for excitation of the reactant gas. In this connection "reactant gas" means the gas and/or gas mixture, which acts on the substrate surface, e.g. the coating-forming gas. In the following the invention will be explained without limitation to examples of coatings.

The construction according to the invention of the remote-plasma-CVD apparatus as an array or assembly of individual plasma source devices or modules (in the following the individual plasma source devices are also referred to as modules) has the advantages that:

the coating region can be adjusted to fit the form and size of the substrate surface by simply connecting individual modules to each other;

in the case of a microwave remote-plasma-CVD process the excitation can occur inside the microwave apparatus components and thus is particularly strong so that the properties of the resulting coating which depend on the degree of excitation can be influenced.

In a preferred embodiment of the invention the coating-forming gas is guided in a laminar flow parallel to the substrate surface over the entire width of the apparatus in the direction of the excitation gas flow out from the modules so that it is mixed with it. The coating-forming gas can however be supplied individually also by the individual modules or by module groups. This embodiment has the advantage that a uniform laminar flow over the entire coating width can be provided, however the disadvantage that additional effort and expenses for distribution of gases to the individual modules or module groups is required.

It is also possible to excite the coating-forming gas prior to mixing it with the exciting gas by an additional energy source. This is then permitted when the coating-forming gas itself does not decompose with coating formation. This feature provides the advantage that the mixture arising of both (excited) types of gas is especially reactive. When only a single energy source is available for excitation of coating-forming gas and excitation gas, then for example the coating-forming gas can be conducted together with the exciting gas, however in an insulated gas tube and mixed with the coating-forming gas in the vicinity of the substrate surface. In case the coating-forming gas is put into the plasma state more easily than the excitation gas, the electric power supplied to the module is largely absorbed by the plasma of the coating-forming gas and is no longer available for excitation of the excitation gas to the required extent. It is thus advantageous to allow the additional excitation to occur only in the vicinity of the module in which the electrical field strength has more or less dropped from its maximum value in energy space according to the difference of the excitation energies of both gases. If the coating-forming gas is more difficult to excite than the excitation gas, then it is advantageous to exchange the roles of both types of gas in regard to the excitation.

In an additional preferred embodiment of the invention the coating-forming gas is supplied by a gas shower device, above which the modular plasma source devices for the excitation gas are located. The outlet openings for the coating-forming gas are formed on the side of the gas shower device facing the substrate. The gas shower device is formed so that excitation gas flowing from its substrate-facing side in the direction of the substrate can pass by or through it. Possible shower devices include a straight pipe, a coiled pipe or a meandering curved pipe. The length and area dimensions of the gas shower correspond to the length of the linear arrangement of plasma source devices and/or the area of the flat arrangement of plasma source devices.

If the modules are arranged in a linear array or a series, then the entire array of source devices is designated as a "remote linear arrangement" in the following. In this type of arrangement the substrate is moved under the source device or this arrangement is guided over the substrate during formation of the coating on the substrate so that the entire substrate is coated by the source devices with a uniform coating.

If the modules are arranged in a planar grid-like arrangement over the substrate surfaces, then the array of source devices is designated as a "remote flat or planar arrangement" in the following. In this type of arrangement relative motion between this arrangement and substrate is only required when the surface area of the substrate is larger than that of the entire arrangement of plasma source devices and/or, if, as already described above, an especially uniform coating should be obtained.

BRIEF DESCRIPTION OF THE DRAWING

The objects, features and advantages of the invention will now be illustrated in more detail with the aid of the following description of the preferred embodiments, with reference to the accompanying figures in which:

FIG. 5a is a diagrammatic plan view of one embodiment of a coaxial module;

FIG. 5b is a diagrammatic plan view of another embodiment of a coaxial module;

FIG. 6 is a diagrammatic plan view of a hollow conduct or module;

FIG. 7a is a diagrammatic plan view of a flat-remote-plasma-CVD apparatus assembled from hollow resonators;

FIG. 7b is a plan view of a flat-remote-plasma-CVD apparatus source assembled from hollow resonators.

DESCRIPTION OF THE PREFERRED EMBODIMENTS

FIGS. 1 to 7b show apparatus, which are especially suitable for performing the process according to the invention.

Figure 1:
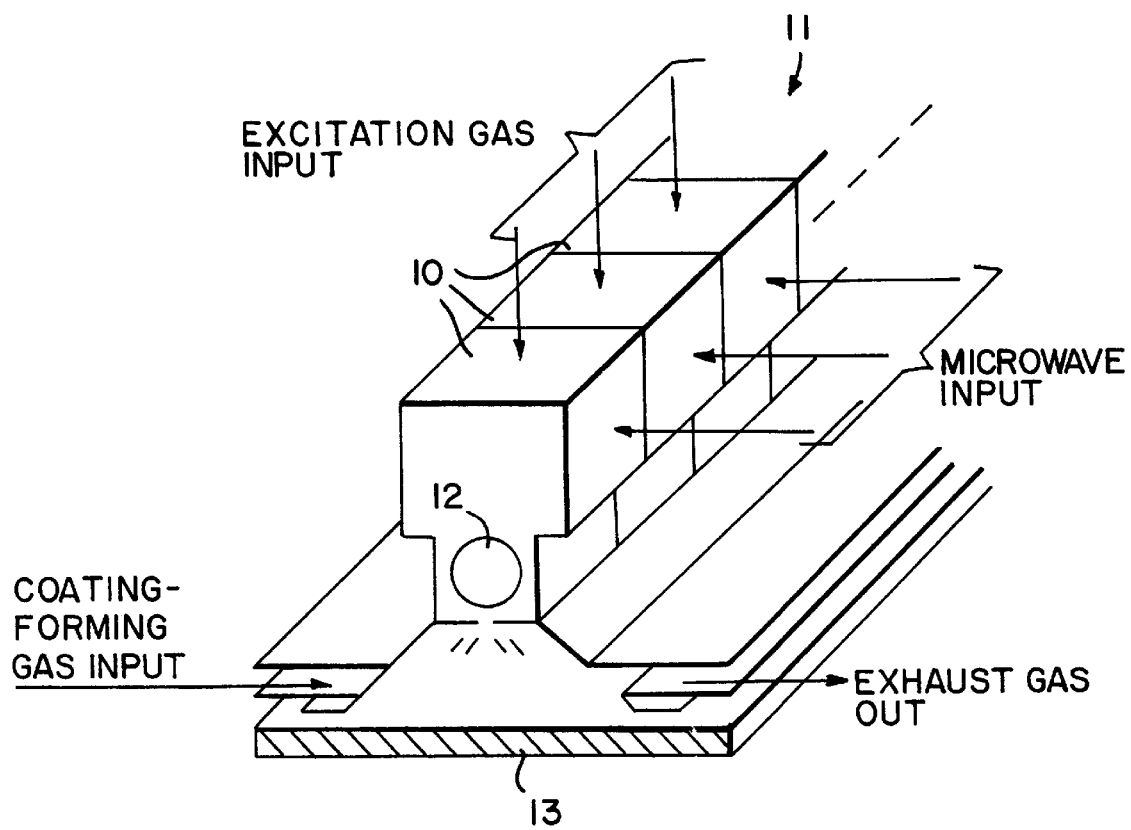
FIG. 1 is a diagrammatic perspective view of a modular linear remote-plasma-CVD apparatus according to the invention.

An apparatus is shown in FIG. 1 which is suitable for coating of a moving substrate. Several modules 10 arranged beside each other form a remote linear arrangement 11 of the plasma source devices or modules 10, in which the excitation preferably occurs by means of microwaves in the illustrated embodiment.

The advantages of producing the plasma by microwaves instead of low frequency excitation are:

no electrodes are needed, the plasma can be maintained at comparatively higher electron densities and also higher pressures than plasmas produced by low-frequency excitation, and coating or etching rates are particularly high.

Each module 10 for microwave excitation can be formed by a microwave hollow wave guide, a microwave resonator, a dielectric pipe supplying the gas to a microwave wave guide or to a microwave resonator or to a coaxial microwave wave guide, whose interior conductor is the plasma of the gas to be excited. In the embodiments shown in the drawing the excitation gas is fed in or supplied from above into each module 10, the microwave energy is supplied generally from the sides. A plasma is ignited at the lower end of the module 10. The excited excitation gas issues subsequently from the module 10 in the direction of the substrate surface 13.

In the illustrated embodiment each module 10 is supplied preferably individually with microwave energy. Microwave energy can either be supplied by a microwave generator associated with each individual module (magnetron) or by microwave coupling of a common microwave wave guide supplying all the modules from one or two magnetrons. This coupling can occur according to known engineering methods, e.g. by a rod antenna, a hole antenna or a slot antenna. The coupling degree for each module is adjusted so that the microwave power decreasing in the microwave propagation direction is balanced by greater coupling. Because the individual modules 10 are controllable and energizable independently of each other, inhomogeneities in the coating properties can be compensated, also by means of the individual supply of microwave power to each individual module. The coating gas flows away in the embodiment shown in FIG. 1 in a laminar flow over the substrate surface 13 and mixes with the excitation gas issuing from the module 10 in the reaction chamber 14 between the linear arrangement 11 of modules 10 and the substrate surface 13. The exhaust gas is pumped away by a vacuum pump(not shown).

Figure 2:
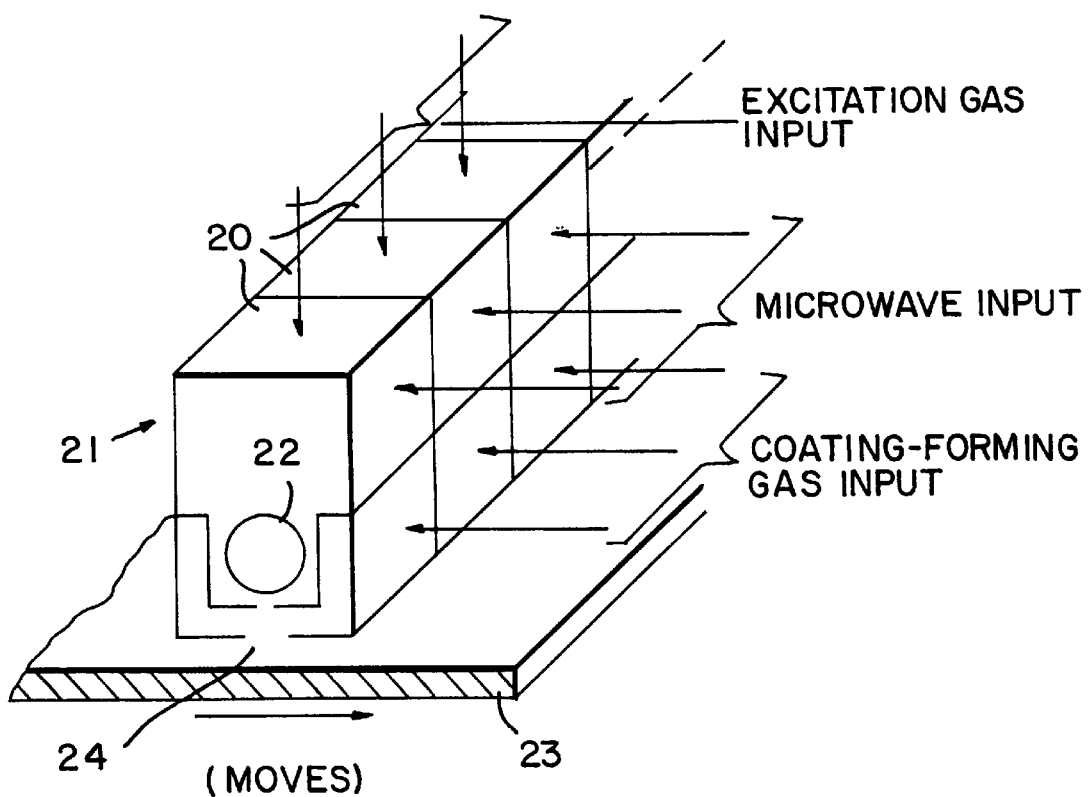
FIG. 2 is a diagrammatic perspective view of an another embodiment of a remote-plasma-CVD apparatus according to the invention, in which the coating-forming gas also is supplied via the individual modules.

FIG. 2 shows a remote linear arrangement 21 of individual plasma source devices or modules 20 in which the coating-forming gas is supplied individually by means of the individual modules 20 and is mixed in the substrate vicinity with the excitation gas. The coating-forming gas is fed in the embodiment of FIG. 2 from the side or laterally into the individual modules 20.

With the apparatus shown in FIGS. 1 and 2 a plasma which is required for the coating forming process can be ignited and maintained for the duration both in plasma-CW (continuous wave) operation and also in plasma-pulsed CVD methods (PICVD) operated in a periodic manner, in which residual gases of past deposition reactions are expelled by fresh gas and the entire substrate is acted on with fresh coating gas. An advantage of the PICVD process is for example that it can be operated with higher powers at reduced substrate temperatures, which, in general, influences the coating quality and adherence beneficially. An advantage of using CW operation is that an economical coating plant can be based on it.

In FIG. 2 the plasma of the excitation gas is indicated with 22 and the reaction chamber is indicated with 24.

Figure 3:
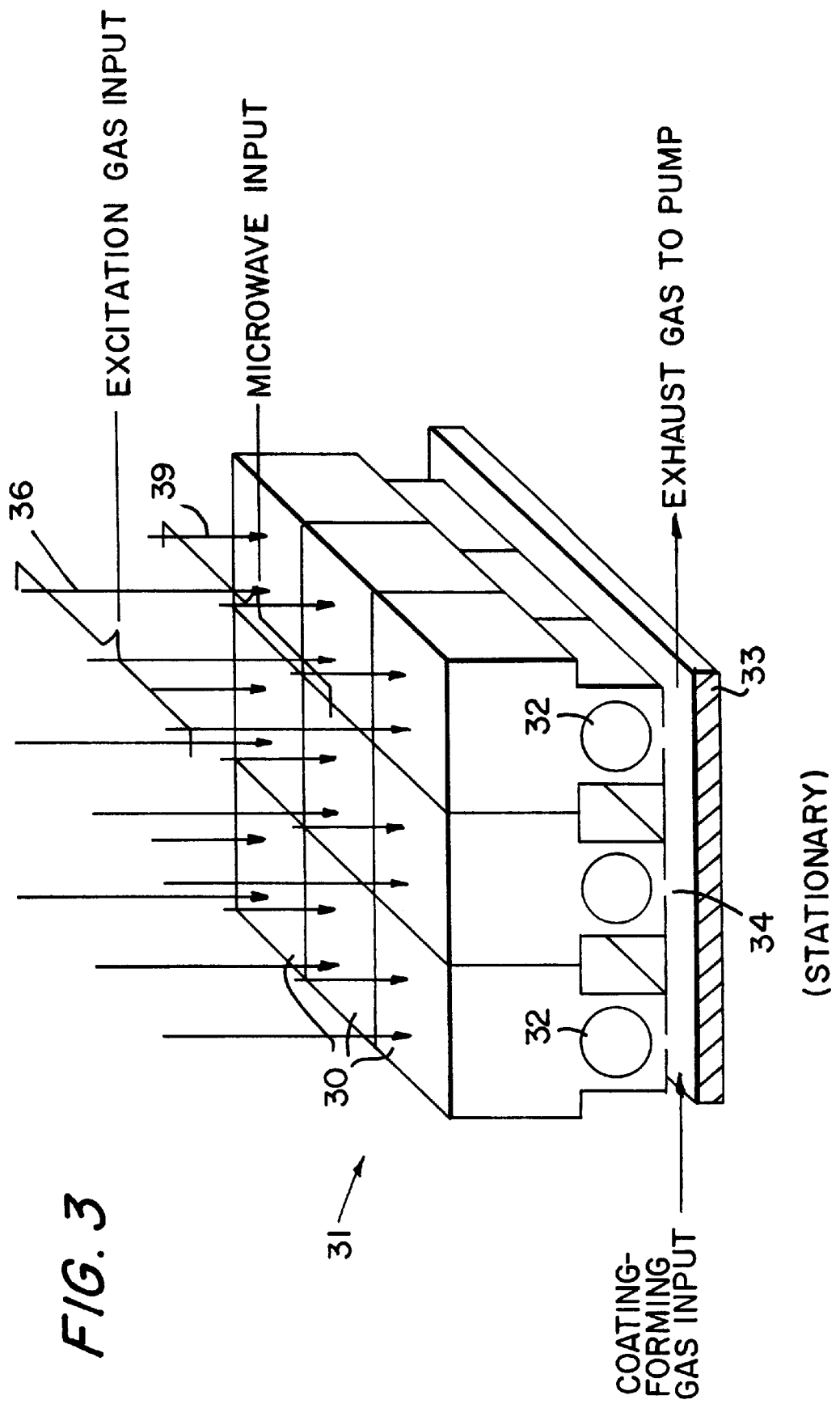
FIG. 3 is a diagrammatic perspective view of a flat remote-plasma-CVD apparatus according to the invention.

FIG. 3 shows a remote flat or planar arrangement 31 of plasma source devices or modules 30, in which the coating-forming gas is conducted in a laminar flow over the substrate as in FIG. 1 and mixes with the excitation gas issuing from the modules 30 perpendicular to this flow. The reaction chamber is indicated with 34 and the plasma of excitation gas is indicated with 32 in FIG. 3; the supply of the excitation gas being shown with 36.

The coating-forming gas would be consumed in a high proportion already in the first module if the coating proceeds with the source shown in FIG. 3 operated with constant microwave supply (CW-operation), so that the subsequent modules would no longer be supplied with an adequate amount of coating-forming gas. A coating plant or apparatus, which operates with an apparatus according to FIG. 3, thus requires absolutely a microwave generator, which is equipped to deliver pulsed microwave power, so that the coating process can occur according to a PICVD process.

Figure 4:
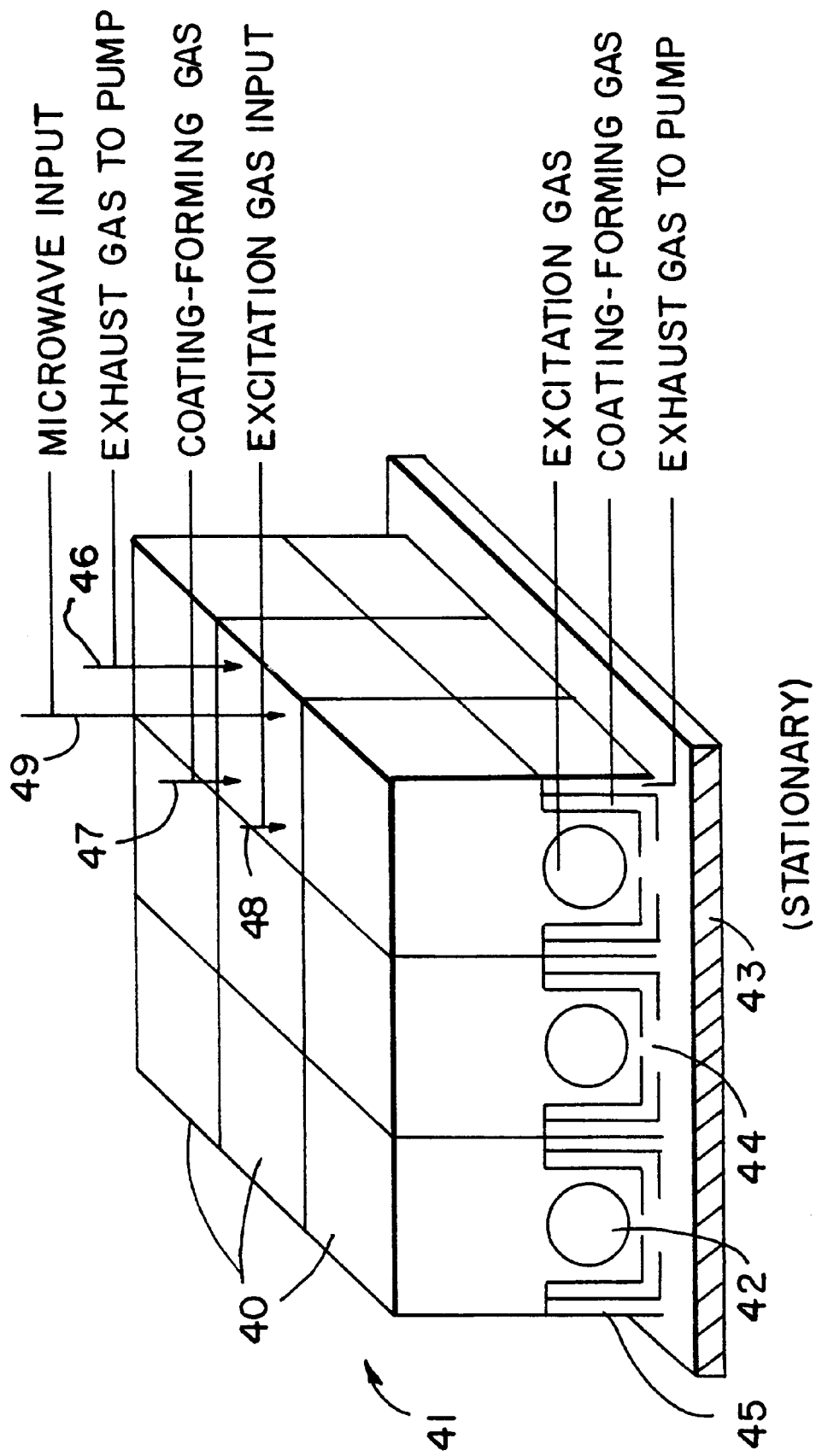
FIG. 4 is a diagrammatic perspective view of an another embodiment of a flat-remote-plasma-CVD apparatus according to the invention, in which gas supply and gas exhaust occurs via the individual modules.

FIG. 4 shows a remote flat arrangement 41 of individual plasma source devices or modules 40, in which the coating-forming gas is supplied by the individual modules 40 individually analogous to FIG. 3 and is mixed in the vicinity of the substrate with the excitation gas.

During coating with this remote flat arrangement with a common exhaust duct and a continuous microwave supply (CW-operation) the uniform removal of exhaust gases from all modules is not guaranteed, since the exhaust gas of the interior modules must be pumped a comparatively longer distance than that of the outer modules. Because of local differences in the process gas mixture the coating rate would be locally nonuniform. A coating plant or apparatus, which operates with the embodiment of FIG. 4, thus requires a microwave generator, which is equipped for delivery of pulsed microwave power, so that coating can occur be means of a PICVD process. In FIG. 4 the substrate 43 is stationary.

The source according to FIG. 4 has an exhaust device 45 associated with the individual modules and can be operated thus in CW operation. The individual exhaust feed 46 issuing from the individual modules, the coating-forming gas feed 47, the excitation gas feed 48, the reaction chamber 44 and the plasma 42 of the excitation gas are shown in FIG. 4. In the embodiments of the apparatus shown in FIGS. 3 and 4 the microwaves are coupled with the individual modules 30/40 via the wave guides 39,49.

In FIG. 5a a plasma source device or module 50 is exemplified, which is suitable for a linear arrangement of plasma source devices because of its geometric properties. It comprises a coaxial microwave guide including an outer conductor or guide comprising a metal pipe 58 and an inner conductor consisting of the ignited exciting plasma 52 in a dielectric tube 59. The balancing of the distribution of the excitation gas over the coating range can occur by widening of the interior tube 59 (FIG. 5b) or by enlarging the spacing to the substrate. The position of the plasma 52 in the pipe 59 can be influenced by the operating parameters of the microwave generator. The tube 59 preferably is made of quartz glass or a multi-component glass.

The module 60 shown in FIG. 6 is preferably suitable for a linear arrangement of plasma source devices and comprises a dielectric tube 69 extending through a rectangular hollow guide 68, which is located at a place of maximum E-field strength, so that an exciting plasma 62 can be ignited in this tube 69.

FIG. 7a shows a remote linear array 71 of plasma source devices 70. The modules 70 are hollow resonators here, which are connected with each other with a rectangular hollow wave guide 78 supplied by a magnetron. Microwaves are coupled into each module 70 from the rectangular hollow wave guide 78, e.g. capacitively. This coupling can also occur by hole or slot antennas. The degree of coupling, which determines the power input to each module, is set or determined by the insertion depth of the coupling antenna in the capacitive coupling, by the hole diameter with the hole coupling and by the length and width of the slot with the slot coupling. The hole and slot coupling is provided by a dielectric microwave window so that the gas type A guided into the hollow resonators cannot flow into the rectangular hollow wave guide 78. On the substrate side an electrically conductive resonator wall 72 can be provided, which can comprise a metallic grid or network, through which the excitation gas can pass.

FIG. 7b shows a remote flat or planar arrangement or array of plasma source devices 73.

Edge effects in the coating and/or treatment of the substrate can occur in the so-called connecting region between the neighboring modules in the above-described arrangement of modular plasma sources. Generally the excitation degree of the excitation gas and the flow properties of the excitation gas and the coating-forming gas differ in these connecting regions in comparison with the regions under these modules.

If a substrate region now passes largely through the connecting regions, thus it has different coating properties than regions outside of itself.

Figure 8A:
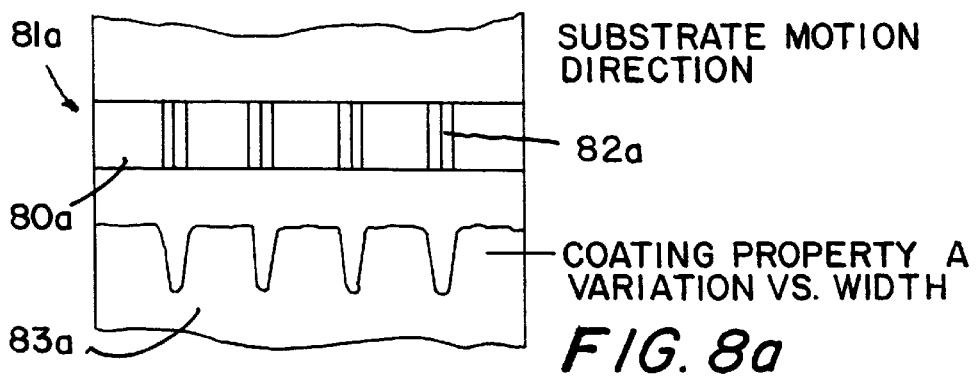
FIG. 8a, 8b and 8c are diagrammatic plan views which show the dependence of the behavior of the coating properties on the angle between the motion direction of the substrate and the axis of the linear plasma source device arrangement.

Of course obviously such edge effects are very strongly dependent on the geometry of the module and/or the module arrangements and especially on the connecting regions. When the individual modules have, e.g., a rectangular, especially square, transverse cross-section, the above-described edge effects are particularly apparent, as seen in FIG. 8a. FIG. 8a shows a remote linear array 81a of plasma source devices 80a comprising a series of modules arranged beside each other with square cross-sections. The substrate is indicated with 83a in FIG. 8a. Furthermore the variation of a coating property A produced by the plasma treatment on the substrate is illustrated in FIG. 8a in this modular arrangement. The substrate in this embodiment is guided under the modular arrangement. A substrate region results which extends exclusively under the connecting regions 82a of the modular arrangement, while the intervening substrate regions extend exclusively under the modules 80a. The action of the plasma treatment or coating under the connecting regions 82a is clearly reduced. This produces notable minimums in the variation of the coating property A depending on the module arrangement at respective corresponding connecting regions between two neighboring modules 80a.

A simple measure for minimizing edge effects consists of moving the substrate and the modular arrangement with respect to each other so that each region of the substrate passes uniformly over the connecting regions and the remaining regions of the modules. This feature is not only suitable for a remote-plasma-CVD, but generally, for any plasma-CVD process with a plasma source arrangement having one or more plasma electrodes or antennas, e.g. also for the electrode arrangement described in German Patent Application DE 38 30 249 C2. The following embodiments can also be used in this technology.

Figure 8B:
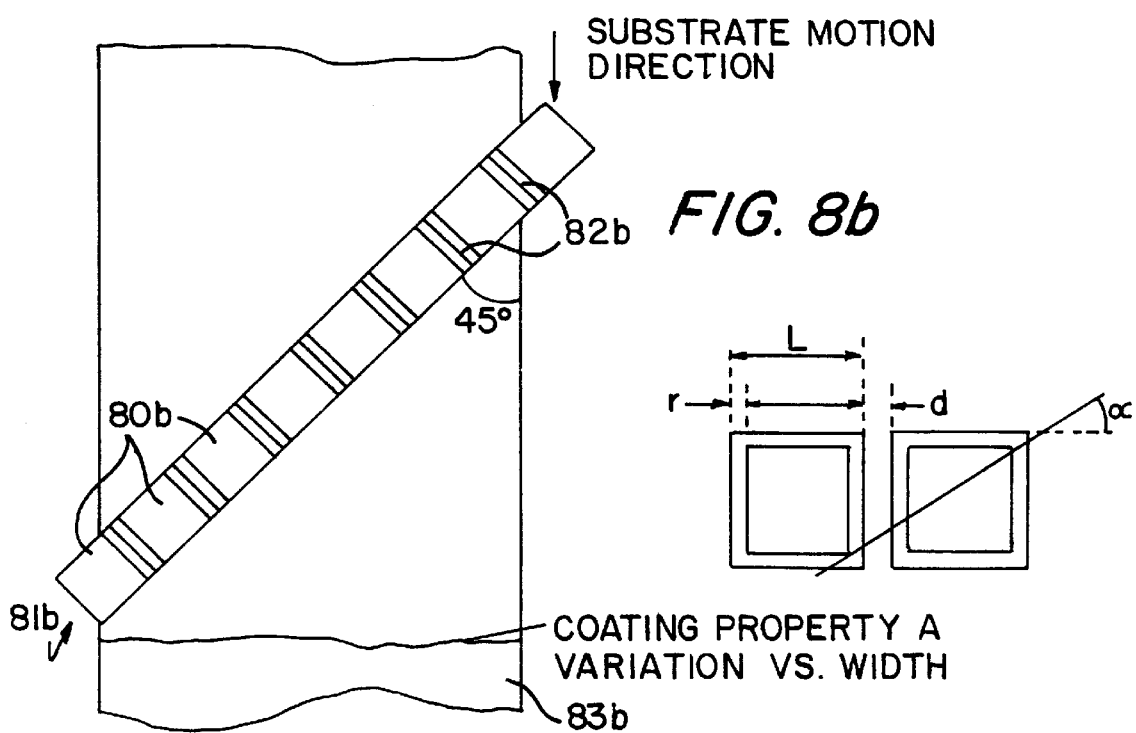
Figure 8C:
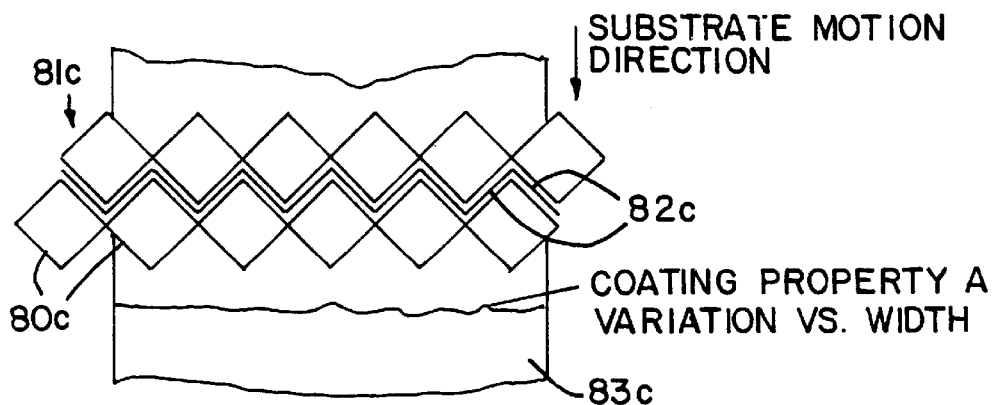

FIGS. 8b to 8c show embodiments of modular arrangements with reduced edge effects in an example of remote linear arrangement of plasma source devices generally without limitation. Obviously the desired effect can be obtained with a number of different embodiments which are not illustrated here. One skilled in the art can easily find the arrangement most suitable for his or her application based on this disclosure.

For example, when the remote linear arrangement of plasma source devices is oriented with its longitudinal axis at an angle $\alpha$ less than 90° to the motion direction of the substrate, the variation of the coating properties with decreasing angle is always less, because the motion vector of the substrate crosses over increasing connection-free regions of the module in the vicinity of the connection regions and a compensating effect is obtained. At an angle of about 45° the motion vector of the substrate at each location on the substrate passes on approximately equal respective linear paths under the connecting regions and under the modules(the exact value may be calculated from the relationship $\alpha=\text{avctg}\{(L-r)/(L+d+r)\}$; L=module length; r=edge zone thickness, i.e. of the strongly inhomogeneous plasma region at the interior module wall; d=2× the thickness of the modular wall+distance to the adjacent module).

FIG. 8b is a schematic illustration of a remote linear arrangement 81b of plasma source devices 80b whose longitudinal axis is oriented at about 45°0 to the motion direction of the substrate 83b and the behavior or variation of a coating property A which is produced by this arrangement. One sees that the curve A is definitely smooth.

FIG. 8c shows a linear arrangement 81c of plasma source devices 80c in a diagrammatic manner, whose longitudinal axis is oriented perpendicular to the motion direction of the substrate 83c and with which the same effect on the coating property is obtained as according to the arrangement of FIG. 8b by inclination of the module 80c about 45° and arranging of pairs of modules behind each other. This arrangements requires less space, however is somewhat more complicated in structure than the arrangement according to FIG. 8b. When one reduces the angle further the compensating effect is of course increased, but because of the many requirements for the modules further reduction in this angle is not economical. This compensating effect may be practically arbitrarily increased—generally with great expense—by a linear remote plasma source and/or a large number of different modules arranged displaced relative to each other. If one arranges the, e.g., several, namely L/S (where S=d +r), linear remote plasma sources under each other, so that they are displaced about a distance or space S with respect to each other, the edge effect may be similarly reduced.

Additional measures for reducing the edge effect include the following:

Gas Permeability of the Intervening Wall

When the module is made from a metallic microwave wave guide, e.g. a rectangular hollow wave guide, which is closed on one side by a gas-impermeable microwave window (dielectric plate) and on the other side by a microwave-impermeable gas window (metallic hole plate or wire sieve), then both a reduction of the edge zone inside the module and a weakening of the effect of the connecting regions between the two modules is obtained. When the conducting separating walls of adjacent modules are gas permeable and microwave impermeable, also for example made from a wire mesh or provided with holes, an equalization of the density of excited species inside the module can occur.

Chance of Spacing to the Substrate

For all modules, the difference of the gas properties in the vicinity of the connecting regions from the remaining portions of the modules and thus the difference in the concerned coatings is the lesser, when the size of the spacing of the module to the substrate is selected to be the greater, because the gas flow issuing from the modules mixes better and is thus equalized better by diffusion.

This measure can however be disadvantageous, especially with a common flow of coating-forming gases to all modules, because the penetration depth of the excitation gas in the coating-forming gas and because of that the depending coating properties (e.g. rate) are always reduced. This possibility must therefore be considered when using this measure.

Increase of the Microwave Power

An additional feature concerns the individual modules. In a module which is made from a metallic microwave wave guide, e.g. a rectangular hollow wave guide, which is closed on one side by a gas-impermeable microwave window (dielectric plate) and on the other side by a microwave-impermeable gas window (metallic perforated plate or wire screen) there is a reduction of the edge zone and thus an equalization of the plasma in the module.

With these stated features a common flow of coating-forming gas can be provided for all modules or an individual flow can be provided for individual modules. Should the greatest possible portion of the coating-forming gas be reacted to form the coating material, it is recommended that in all cases a PICVD process be employed. Because of that it is guaranteed that unreacted coating-forming gas is present under the surfaces of the module prior to each coating pulse.

The disclosure in German Patent Application 196 43 865.9-45 of Oct. 30, 1996 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a remote-plasma-CVD method for coating or for treating large-surface substrates and apparatus for performing same, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

I claim:

1. A remote-plasma-CVD process for coating or treating substrates, said remote-plasma-CVD process comprising the steps of:

a) exciting an excitation gas in a plurality of modular plasma source devices (10,80b) arranged in a linear array with connecting regions (82b) between adjacent ones of said modular plasma source devices (10,80b), said linear array having a longitudinal axis;

b) arranging said linear array of said modular plasma source devices (10,80b) over said substrate surface to be coated or treated so that said linear array extends completely across said substrate surface from one side to another;

c) feeding a reactant gas with the excitation gas from the modular plasma source devices (10,80b) to the substrate surface to excite the reaction gas with the excitation gas and thus form a coating on the substrate surface or treat the substrate surface; and d) during the feeding of step c), moving the substrate relative to the linear array in a substrate motion direction so that the linear array is inclined at an angle ($\alpha$) of 45° relative to the substrate motion direction, whereby a uniform coating or treatment of said substrate surface is obtained despite said connecting regions between said modular plasma source devices (10,80b).

2. The process as defined in claim 1, wherein said exciting of said excitation gas is by microwaves and a plasma is formed in said excitation gas by said microwaves.

3. The process as defined in claim 2, wherein said exciting of said plasma by said microwaves is pulsed so that a pulsed remote-plasma-CVD process is performed.

4. The process as defined in claim 2, further comprising selecting a microwave energy of said microwaves input into individual ones of said modular plasma source devices large enough so that edge effects due to said connection regions between adjacent ones of said modular plasma source devices is minimized.

* * * * *